United States Patent

Fujii

[11] Patent Number: 6,106,352
[45] Date of Patent: Aug. 22, 2000

[54] METHOD FOR FABRICATION OF ORGANIC ELECTROLUMINESCENT DEVICE

[75] Inventor: Hiroyuki Fujii, Moriguchi, Japan

[73] Assignee: Sanyo Electric Co., Ltd., Osaka, Japan

[21] Appl. No.: 09/271,238

[22] Filed: Mar. 17, 1999

[30] Foreign Application Priority Data

Mar. 18, 1998 [JP] Japan ................................. 10-068568

[51] Int. Cl.[7] .................................................. H05B 33/10
[52] U.S. Cl. ............................................................. 445/24
[58] Field of Search ................................... 313/505, 509; 445/24

[56] References Cited

U.S. PATENT DOCUMENTS

| | | | |
|---|---|---|---|
| 5,445,899 | 8/1995 | Budzilek et al. | 313/505 |
| 5,670,792 | 9/1997 | Utsugi et al. | |
| 5,684,365 | 11/1997 | Tang et al. | |
| 5,757,026 | 5/1998 | Forrest et al. | |
| 5,834,893 | 11/1998 | Bulovic et al. | |
| 5,844,362 | 12/1998 | Tanabe et al. | |
| 5,846,854 | 12/1998 | Giraud et al. | |

FOREIGN PATENT DOCUMENTS

| | | |
|---|---|---|
| 57-185607 | 11/1982 | Japan . |
| 64-45084 | 2/1989 | Japan . |
| 4-32560 | 2/1992 | Japan . |
| 7-142168 | 6/1995 | Japan . |
| 7-220873 | 8/1995 | Japan . |
| 8-54836 | 2/1996 | Japan . |
| 8-234683 | 9/1996 | Japan . |
| 8-315981 | 11/1996 | Japan . |
| 10-172761 | 6/1998 | Japan . |
| 10-172764 | 6/1998 | Japan . |
| 10-302965 | 11/1998 | Japan . |

*Primary Examiner*—Kenneth J. Ramsey
*Attorney, Agent, or Firm*—Arent Fox Kintner Plotkin & Kahn, PLLC

[57] ABSTRACT

A method of fabrication of organic electroluminescent device having an organic electroluminescent layer between a first electrode and a second electrode, including the steps of forming a set of first electrode elements on a principal surface of a support to provide the first electrode, forming an insulation layer to overlie the first electrode elements as well as open regions between the first electrode elements so that the insulation layer defines a substantially smooth top surface, removing a surface portion of the insulation layer to a level sufficient to expose clean top surfaces of the first electrode elements so that the insulation layer and the first electrode have a common top surface, and sequentially forming the organic electroluminescent layer and the second electrode on the common top surface.

22 Claims, 4 Drawing Sheets

METHOD FOR FABRICATION OF ORGANIC ELECTROLUMINESCENT DEVICE

BACKGROUND OF THE INVENTION

1. Field of the Invention

The present invention relates to a method for fabrication of an organic electroluminescent device utilizing an electroluminescent (EL) phenomenon produced in organic substances.

2. Related Art

Known electroluminescent (may hereinafter be referred to as EL) devices include organic and inorganic EL devices. In particular, the organic EL devices have come into widespread use in displays for their capability to be driven at low voltages.

FIG. 4 is a sectional view, illustrating a prior art display utilizing the organic EL device. Overlying a glass support 1 is a parallel set of strip-form transparent electrodes 2 which extends in a direction perpendicular to a paper surface of FIG. 4. The parallel set of transparent electrodes 2 constitutes a first electrode. An organic EL layer 7 is deposited over an entire surface of the support 1 inclusive of the transparent electrodes 2. Formed on top of the organic EL layer 7 is another parallel set of strip-form back electrodes 6 constituting a second electrode and oriented to intersect the set of transparent electrodes 2. One EL cell is defined between one transparent electrode 2 and one intersecting back electrode 6 to provide one pixel.

The organic EL layer 7 is constructed by sequentially stacking an organic hole injecting and transporting layer, a luminescent layer and an organic electron injecting and transporting layer.

Since the organic EL layer 7 has a reduced thickness relative to the transparent electrodes 2, the organic EL layer 7 is relatively thinned at its portions overlying side slopes of the transparent electrodes 2, as indicated by "N" portions in FIG. 4. Those "N" portions become thinner particularly when the organic EL layer 7 is deposited by a dry process, such as vacuum vapor deposition, wherein the organic EL layer 7 is deposited along irregular profiles of the transparent electrodes 2. On the other hand, the organic EL layer 7 is relatively thickened at its portions overlying leveled central surfaces of the transparent electrodes 2, as represented by an "M" portion, where it exhibits increased resistance relative to "N" portions. As a result, in each pixel region, a relatively higher current flows in the thinner "N" portions than in the thicker "M" portion. This causes the "N" portions of the organic EL layer 7 to emit brighter light, leading to inhomogeneous emission as well as the reduction in dielectric strength of the organic EL layer.

The back electrodes 6 are also irregularly surfaced, as shown in FIG. 4, to possibly result in the occurrence of damages at elevated portions thereof or of cracks therein.

One possible measure to overcome such problems would be to deposit the organic EL layer on an electrode-embedded flat surface. In Japanese Patent Laying-Open No. Sho 57-185607 (1982), a technique is disclosed which can fabricate a patterned electrode having a flat surface.

FIG. 5 is a sectional view, showing a series of processes for fabrication of the patterned electrode disclosed in the above-identified publication. As shown in FIG. 5(a), a layer of transparent electrode 2 is first formed on a glass support 1. Then, a patterned photoresist 9 is formed on the layer of transparent electrode 2, as shown in FIG. 5(b). By a wet process using an etching solution, the layer of transparent electrode 2 is etch removed from the regions where there is no photoresist 9, so that the pattern of the photoresist is transferred to the transparent electrode 2, as shown in FIG. 5(c).

As shown in FIG. 5(d), an insulation layer 8 is deposited to overlie the patterned transparent electrode 2 and the remaining open regions of the glass support 1. A thickness of the insulation layer 8 is selected to approximate to that of the transparent electrode 2.

The publication states that the patterned electrode having a flat or smooth surface, as shown in FIG. 5(e), can be formed by subsequent removal of the photoresist 9 together with portions of the insulation layer 8 overlying the photoresist 9, by plasma etching or by invasion of a stripping solution.

However, the plasma etching is not considered to be an actually effective technique to remove the photoresist 9 and the overlying insulation layer 8 portions, because of the following reasons.

That is, a total thickness of the photoresist 9 and insulation layer 8 overlying the patterned transparent electrode 2 actually becomes larger than a thickness of the insulation layer 8 overlying the glass support 1 regions where there exists no transparent electrode 2. Accordingly, the removal of the photoresist 9 and insulation layer 8 from regions overlying the patterned transparent electrode 2 by plasma etching results in the simultaneous removal of surface portions of the insulation layer 8 overlying the glass support 1 regions where there is no transparent electrode 2. The attempt to form such a patterned electrode having a flat surface as shown in FIG. 5(e) thus fails.

Accordingly, the use of a stripping solution would be a necessary selection for removal of the photoresist 9 and insulation layer 8 from regions overlying the transparent electrodes 2. Where the stripping solution is used, a slight amount of impurities often remains on the transparent electrodes 2. The subsequent formation of an organic charge injecting and transporting layer thereon creates a problem that those impurities interfere with charge injection from the transparent electrodes to the organic charge injecting and transporting layer to thereby degrade characteristics. Examples of such impurities include high-molecular weight ingredients contained in the photoresist, water contained in the stripping solution and the like. These impurities deposit on transparent electrode surfaces in the form of physical and/or chemical adsorption.

Accordingly, the method disclosed in the above-identified publication is required to include a process of removing a slight amount of impurities left on the electrode surfaces after the formation of flat-surfaced, patterned electrode with the use of stripping solution. This complicates a manufacturing process of organic EL devices, as well as imposing a problem of increased cost.

SUMMARY OF THE INVENTION

An object of the present invention is to provide a method capable of fabricating, in a simplified manner, an organic electroluminescent device which produces homogeneous and stable emission from an entire region of each pixel defined between a first electrode and a second electrode and which is configured to prevent the second electrode from being damaged.

The manufacturing method of the present invention includes the steps of providing a set of strip-form first electrodes which are spaced apart from each other on a principal surface of a support, forming an insulation layer to overlie the first electrodes as well as open regions between the first electrodes so that the insulation layer defines a substantially flat surface elevated from a top surface of the set of strip-form first electrodes, and removing a surface portion of the insulation layer to a level sufficient to expose clean top surfaces of the first electrodes so that the insulation layer and the first electrodes have a common top surface. The method further includes the steps of forming an organic electroluminescent layer on the common top surface and forming a second electrode on the organic electroluminescent layer.

In accordance with the present invention, the organic electroluminescent layer can be formed on a flat-surfaced patterned electrode, i.e., on the common top surface of the insulation layer and first electrodes. The formation of irregularities on the organic electroluminescent layer is thus prevented to thereby insure a uniform thickness thereof which consequently allows homogeneous emission from the organic electroluminescent layer. Also, due to the substantial absence of irregularities, a surface of the second electrode is rarely subjected to damage.

In the present invention, the insulation layer is formed preferably from an insulative polymer which preferably exhibits fluidity when exposed to heat. Useful insulative polymers include thermoplastic resins, thermosetting resins and photo-curable resins. The insulation layer when formed from the insulative polymer exhibits the reduced change in properties with time than when formed from a monomeric material to thereby impart a prolonged service life to a resulting organic electroluminescent device.

One technique to form the insulation layer from the insulative polymer involves depositing a melt of the insulative polymer to overlie the first electrodes, and cooling the deposited material for solidification into the insulation layer. Specifically, the melt of the polymer is cast deposited to overlie the first electrodes and then cooled to form the insulation layer.

Another technique to form the insulation layer from the insulative polymer entails dissolving the polymer in a solvent to form a solution, casting the solution to coat the first electrodes and removing the solvent from the cast solution to form the insulation layer.

In the present invention, a suitable selection of an insulation layer-forming material is preferably made so that the resulting insulation layer exhibits a refractive index lower than that of the transparent electrodes. In an exemplary case where ITO (indium-tin oxide) is used to form the transparent electrodes having a refractive index of 1.9, a material having a refractive index of below 1.9 may preferably be employed to form the insulation layer. The refractive index of the insulation layer is preferably at least 3%, more preferably at least 10%, still more preferably at least 15% lower than that of the transparent electrodes.

The reduced refractive index of the insulation layer relative to the first electrodes improves the efficiency with which light emitted from the luminescent layer is introduced into the first electrodes. Also, the light introduced into the first electrodes is allowed to exit through the support without leaking to the insulation layer, resulting in the improvement in efficiency with which the light is taken out and accordingly in the reduced power consumption of the organic electroluminescent device.

In the present invention, a step of removing a surface portion of the insulation layer is preferably performed by UV etching under an oxygen-containing atmosphere. In this etching process, the insulation material deposited and any impurity adsorbed on the first electrode surfaces are photo-excited upon exposure to an ultraviolet radiation and caused to react with oxygen for oxidative destruction thereof. Consequently, the first electrode surfaces can be brought and maintained in a very clean condition.

The aforementioned dry etching, such as UV etching and plasma etching, may preferably be carried out under the atmosphere having an ozone concentration of at least 0.01 g/m$^3$. The ozone concentration within the above-specified range effectively promotes oxidative destruction of the insulation material deposited and impurities adsorbed on the first electrode surfaces, so that surface cleaning of the first electrodes can be effected at an increased rate.

It is assumed from a general theory of electron transfer between materials that the reduced difference in ionization potential between the first electrode and an organic EL layer-constituting layer (an organic hole injecting and transporting layer, for example) located in direct contact with the first electrode facilitates injection of carriers from the first electrode to the organic EL layer-constituting layer. Accordingly, if the first electrode is etched such that its ionization potential is rendered closer in level to an ionization potential of the organic EL layer-constituting layer in direct contact with the first electrode, a surface of the first electrode is brought into a condition suitable for carrier injection to the EL layer-constituting layer, resulting in the formation of an organic EL device which can be driven at low voltages. The difference in ionization potential between the first electrode and the organic EL layer-constituting layer, such as the organic hole injecting and transporting layer, disposed in direct contact with the first electrode, is preferably not higher than 0.3 eV (electron volts), more preferably not higher than 0.2 eV.

Preferably, the aforementioned etching is carried out so that an absolute value of an ionization potential of the first electrode is at least 4.7 eV, more preferably at least 4.8 eV. The absolute value of ionization potential of the first electrodes is a value when a vacuum level is taken as a reference zero level.

If etching is performed such that the absolute value of ionization potential of the first electrodes is at least 4.8 eV, the first electrode surfaces may be brought into conditions suitable for hole injection to the organic hole injecting and transporting layer, for example. This results in the formation of an organic electroluminescent device which can be driven at a reduced voltage.

In the present invention, the removal of a surface portion of the insulation layer can also be accomplished by plasma etching.

The organic electroluminescent layer in the present invention may include a luminescent layer, and an organic hole injecting and transporting layer or/and an organic electron injecting and transporting layer, for example. Specifically, the organic electroluminescent layer may have a three-layer structure consisting of the organic hole injecting and transporting layer, luminescent layer and organic electron injecting and transporting layer; a two-layer structure consisting of the organic hole injecting and transporting layer and the luminescent layer; or a two-layer structure consisting of the organic electron injecting and transporting layer and the luminescent layer, for example. Also, it may have a multi-layer structure including four or more layers.

A variety of known systems as practiced heretofore can be employed to drive the organic electroluminescent device of the present invention. Such a drive system may be a simple matrix system or a TFT active matrix system, for example.

In the organic electroluminescent device adapted for use with the simple matrix system, the first electrode on the support consists of a set of strip-form electrode elements. Likewise, the second electrode consists of a set of strip-form electrode elements which extends substantially perpendicular to the set of first electrode elements. In such a case, subsequent to the process of providing the common top surface of the insulation layer and first electrode, a set of electrically insulative spacer walls may be formed on the common top surface to extend in a direction substantially perpendicular to the set of first electrodes, on which the organic EL layer and the set of second electrodes are sequentially stacked, in accordance with a known process such as disclosed in Japanese Patent Laying-Open No. Hei 8-315981 (1996).

In the organic electroluminescent device adapted for use with the TFT active matrix system, the first electrode is formed on the support carrying a thin film transistor (TFT). In this case, the first electrode may serve as a drain or source electrode for the thin film transistor, or as an electrode electrically connected to a separate drain or source electrode. Alternatively, a flattened, intermediate insulation film may be placed between the TFT and first electrode, according to known processes, to electrically connect the first electrode with the drain or source electrode for the TFT through contact holes provided in the intermediate insulation film.

DESCRIPTION OF THE PREFERRED EMBODIMENTS

Figure 1A:
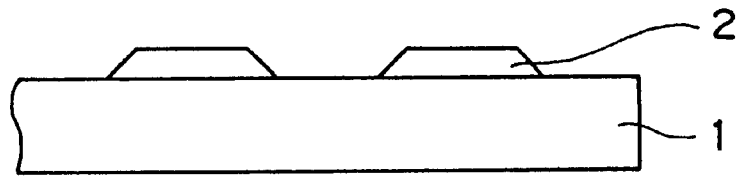
FIG. 1, parts 1(a) through 1(d) are fragmentary sectional views, illustrating a series of processes for fabrication of one embodiment of an organic electroluminescent device in accordance with the present invention.

FIGS. 1(a) through 1(d) are fragmentary sectional views, illustrating a series of processes for fabrication of an organic electroluminescent device (may also be referred to as EL), as a first embodiment in accordance with the present invention. Referring first to FIG. 1(a), a parallel set of strip-form transparent electrodes 2 is pattern formed on an insulative glass support 1. The transparent electrodes 2 extend in a direction perpendicular to a paper surface of FIG. 1(a). A thickness of the transparent electrodes 2 may be 200 nm, for example, and is permitted to vary within the range of 80 nm–2 μm, preferably within the range of 100 nm–1 μm.

In this particular embodiment, the set of transparent electrodes 2 is formed from indium-tin oxide (ITO) Patterning thereof can be carried out by using a wet etching technique with an aqueous solution of hydrochloric acid containing $FeCl_3$. Other known patterning techniques may also be employed.

Figure 1B:
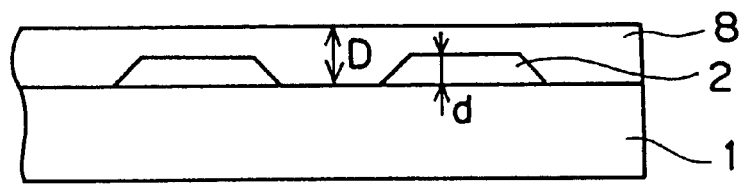

Referring now to FIG. 1(b), an insulation layer 8 is formed over an entire region of the glass support 1 to overlie the glass support 1 and the transparent electrodes 2. In this particular embodiment, the insulation layer 8 is formed from low-density polyethylene having a long-chain, branched molecular structure which exhibits a density of 0.915 g/cm$^3$ at 25° C. and a melting point of 115° C. The density of low-density polyethylene at 25° C. is permitted to vary within the range of 0.90 g/cm$^3$ –0.93 g/cm$^3$. Its melting point is also permitted to vary within the range of 107° C.–120° C. The insulation layer 8 is formed by melting the above-specified low-density polyethylene at 190° C. and casting the polyethylene melt over the entire region of the glass support 1. A temperature used to melt polyethylene may be permitted to fall within the range of 110° C.–320° C., preferably within the range of 150° C.–230° C., more preferably within the range of 170° C.–210° C.

As illustrated in FIG. 1(b), a thickness of the insulation layer 8 located in regions between neighboring transparent electrodes 2 is given by D. In this embodiment, the thickness D measures 1 μm, for example. The thickness D is chosen to exceed a thickness d of the first electrodes 2, and may preferably be in the range of 1.1 d–4 d, more preferably in the range of 1.5 d–3.0 d, most preferably in the range of 2.4 d–2.6 d.

In the aforementioned casting process, a temperature of the glass support 1 may be maintained at about 60° C., for example. The temperature of the glass support 1 is suitably chosen not to rapidly solidify the polyethylene melt, and may be in the range of 0° C.–105° C., preferably in the range of 40° C.–80° C.

Also in the casting process, the glass support 1 may preferably be rotated at a suitable rate, so that a thickness variance of the cast polyethylene melt can be controlled within an acceptable range by the action of a centrifugal force. As a result, the insulation layer 8 can be formed having a surface profile closer to flat or smooth.

While the casting is performed in the manner as described above, a tension acts on a surface of the polyethylene melt to result in automatic formation of the insulation layer 8 having a flat or smooth surface.

In this embodiment, the insulation layer 8 in the regions overlying the transparent electrodes 2 has a thickness of (D–d).

The insulation layer 8, formed of polyethylene, exhibited a refractive index of 1.51, relative to a D line with a wavelength of 589 nm at 20° C. in the Fraunhofer lines. The refractive index, as used hereinafter, similarly refers to a refractive index as measured relative to light having a wavelength of 589 nm at 20° C.

Figure 1C:
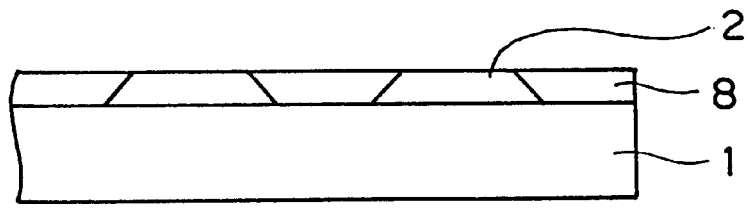

The insulation layer 8 is UV etched at its entire surface under the oxygen-containing atmosphere, as shown in FIG. 1(c). The etching is continued until clean surfaces of the transparent electrodes 2 are exposed to outside. This etching creates a common top surface of the insulation layer 8 and the transparent electrodes 2. That is, the etching reduces in thickness the insulation layer 8 in the regions where there is no transparent electrode 2 to a thickness dimension of d which matches in value to that of the transparent electrodes 2.

During the etching process, a temperature of the glass support 1 is controlled at 60° C., for example, while permitted to vary within the range of 0° C.–105° C., preferably within the range of 40° C.–80° C. The etching is performed under the oxygen atmosphere containing ozone ($O_3$) which atmosphere is created by supplying a pure oxygen gas at a constant volumetric flow rate of 3 L/min into a creeping discharge type ozonizer. Also, the etching is performed by exposure to ultraviolet radiation having two main peak wavelengths at 185 nm and 254 nm from two low-pressure mercury lamps each having an input power of 300 W.

Where a wall surface of each lamp is spaced from the highest surface level of the assembly by a distance of 5 mm, a time period required for the etching to achieve exposure of clean surfaces of the transparent electrodes 2 is about 15 minutes. However, a dimension of the spacing may be arbitrarily determined, as long as the ultraviolet radiation from each lamp is strong enough to maintain a sufficient intensity at a surface of the assembly.

In this particular embodiment, an ozone concentration in the vicinity of the insulation layer 8 reaches 9.8 g/m$^3$. However, the ozone, if present in the concentration of at least 0.01 g/m$^3$, is effective in promoting oxidative destruction of the insulation material and any existing impurity. The ozone concentration is preferably at least 0.1 g/m$^3$, more preferably at least 1 g/m$^3$, most preferably at least 5 g/m$^3$.

Subsequently, an organic EL layer 7 is formed on the common top surface. Accordingly, a separate process of cleaning the exposed surfaces of the transparent electrodes 2 can be omitted here. A parallel set of spaced apart strip-form back electrodes 2 is deposited on the organic EL layer 7 by using a vacuum vapor deposition technique to extend in a direction perpendicular to or intersect the parallel set of transparent electrodes 2.

Figure 1D:
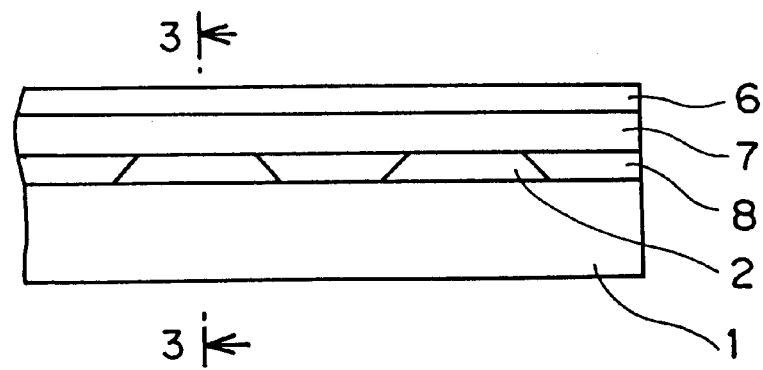
Figure 2:
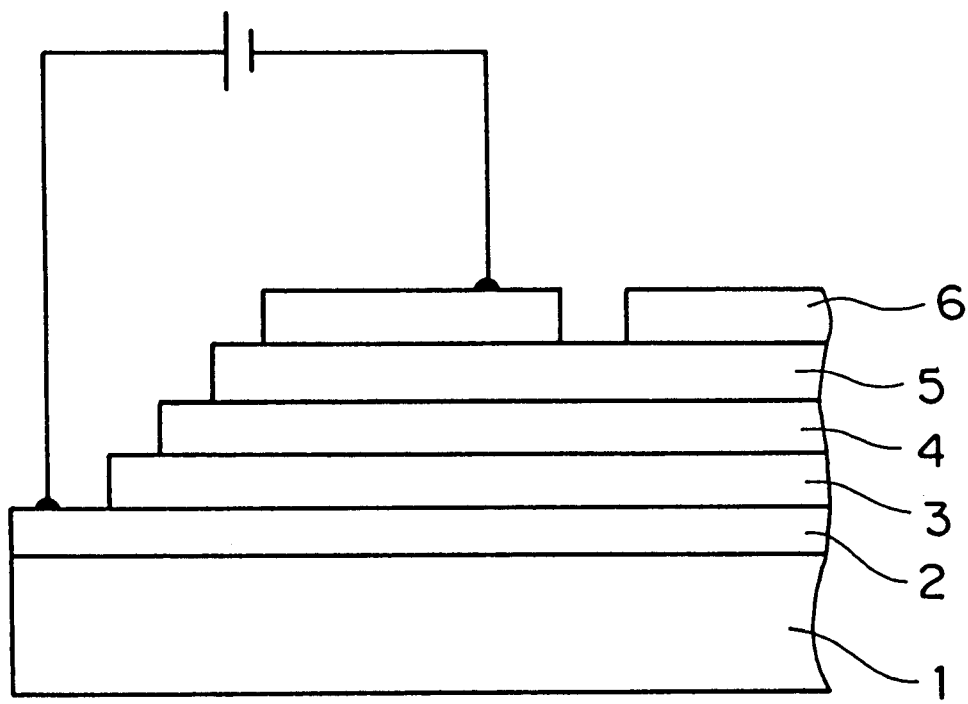
FIG. 2 is a fragmentary sectional view taken along the line A—A of FIG. 1(d)

FIG. 2 is a fragmentary sectional view taken along the line A—A of FIG. 1(d). As shown in FIG. 2, the organic EL layer 7 is constructed by sequentially stacking an organic hole injecting and transporting layer 3, a luminescent layer 4 and an organic electron injecting and transporting layer 5.

The transparent electrodes 2 are formed from ITO in this embodiment. However, other materials such as tin oxide ($SnO_2$) and gold (Au) may also be employed to form the transparent electrodes 2.

The organic hole injecting and transporting layer 3 is formed from 4, 4', 4"-tris(3-methylphenylphenylamino) triphenyl amine (generally called "MTDA"), derived from triphenylamine. A thickness of the organic hole injecting and transporting layer 3, while permitted to vary within the range of 10 nm–80 nm, is chosen to be 70 nm in this embodiment.

The luminescent layer 4 can be formed from N, N'-diphenyl-N, N'-dibenzyl[1, 1'-biphenyl]-4, 4'-diamine (generally called "TPD") to which 5, 6, 11, 12-tetraphenylnaphthacene (generally called "Rubrene") is added in the amount of 5 weight %, based on the weight of TPD. The amount of Rubrene by weight may be varied within the range of 0.5%–15%, preferably within the range of 2%–6%, based on the weight of TPD. A thickness of the luminescent layer 4, while permitted to vary within the range of 5 nm–45 nm, is chosen to be 20 nm in this embodiment.

The organic electron injecting and transporting layer 5 is formed from aluminum tris(quinoline-8-olate) (generally called "$Alq_3$"). A thickness of the organic electron injecting and transporting layer 5, while permitted to vary within the range of 10 nm–80 nm, is chosen to be 60 nm in this embodiment.

The back electrodes 6 are formed from an alloy, i.e., by codepositing Mg and In with a ratio in weight of 9:1. A thickness of the back electrodes 6, while permitted to vary within the range of 50 nm–500 nm, is chosen in this embodiment to be 200 nm. Also, the In content is permitted to vary within the range of 0.01%–95%, preferably within the range of 1%–75%, more preferably within the range of 5%–25%, based on the weight of Mg.

Upon application of a voltage in the approximate range of 5–20 volts across arbitrary pixels between the respective first and second electrodes, the aforementioned organic EL display device is driven, so that electrons and holes are injected to the luminescent layer 4 respectively from the electron injecting and transporting layer 5 and hole injecting and transporting layer 3. The hole-electron recombination in the luminescent layer 4 results in electroluminescence of the pixels.

In this embodiment, the organic EL display device defines a common top surface of the transparent electrodes 2 and insulation layer 8, as shown in FIG. 1(c). The successive superposition of the organic EL layer 7 and the back electrodes 6 on the common top surface thus assures flat or smooth surface conditions thereof, leading to uniform thickness of the organic EL layer 7. Consequently, the organic EL device when driven produces homogeneous emission, corresponding to the electrode configuration. Also, the smooth-surfaced back electrodes 6 are prevented from being damaged.

The organic EL device thus fabricated was evaluated for emission efficiency.

In preparing a test sample of organic EL device for evaluation, each transparent electrode 2 and each back electrode 6 arranged to intersect the transparent electrode 2 were respectively dimensioned in width to be 2 mm to thereby provide a luminescent square having an area of 4 mm$^2$ per pixel. At an applied voltage of 3 volts, the organic EL device emitted green light having a luminance of 0.6 cd/m$^2$.

The luminance increased with higher voltages applied, and measured 5,000 cd/m$^2$ at an applied voltage of 10 volts and 54,000 cd/m$^2$ at an applied voltage of 15 volts.

The spectral analysis of this green emission revealed the coincidence with a maximum fluorescent wavelength of Rubrene incorporated in the luminescent layer 4, i.e., the presence of a maximum peak emission at a wavelength of 562 nm. An excited state of Rubrene is thus considered responsible for the green emission.

A continuous emission test was then conducted by using a DC constant-current power source which continuously applied a DC voltage to yield a constant current density of about 5 mA/cm$^2$ in the organic EL device which initially exhibited a luminance of 500 cd/m$^2$. A time period during which the luminance is reduced to a half of the initial luminance, i.e., a luminance half life was measured as being 1,300 hours.

At the completion of the process shown in FIG. 1(c), the transparent electrode 2 was at its surface measured for ionization potential. Results revealed the ionization potential of 4.83 eV, when a vacuum level was taken as a reference zero level. The ionization potential was determined using a measuring equipment RIKEN AC-1, manufactured by Riken Keiki Co., Ltd., under the following conditions; room temperature=about 20° C., quantity of UV radiation=650 nW, and counting period=5 seconds. The determination was made on the basis of a principle of low-energy electron counting system utilizing UV irradiation under ambient atmosphere.

The ionization potential of MTDATA constituting the organic hole injecting and transporting layer 3 was determined. MTDATA powders previously purified through sublimation were used to prepare a test sample. The ionization potential of the sample was measured in the manner as described above to result in a determined value of 5.0 eV.

It is known from the highly-recognized modern theory of electron transfer that a charge transfer between the two contacting layers is eased to an increased degree with the reduced difference in energy level therebetween.

A value of the ionization potential directly indicates an energy level of the highest occupied electron orbit of the subject material. In the above embodiment of the organic EL device, the difference in energy level between the transparent electrode 2 and the organic hole injecting and transporting layer 3 is then calculated to be (5.0–4.83) eV, i.e., less than 0.2 eV, which is a very small value. This is considered responsible for the highly efficient hole injection from the transparent electrodes 2 to the organic hole injecting and transporting layer 3, which enabled emission of the relatively bright light measuring a luminance of 0.6 cd/m$^2$ even at the relatively low applied voltage of 3.0 volts.

In the first embodiment as described above, the UV etching under the oxygen atmosphere was performed to remove a surface portion of the insulation layer. In an alternative embodiment which follows, the surface portion of the insulation layer is removed by plasma etching under the similar oxygen atmosphere. A glass support 1 bearing the transparent electrodes 2 and the insulation layer 8 is placed in a chamber controlled at a temperature of 20° C., so that the glass support 1 is increased to and maintained at 20° C. An interior of the chamber is first evacuated to a pressure of 0.4 mPa. A pure oxygen gas is then introduced into the chamber at a flow rate of 3.5 sccm, i.e., at a flow rate of 3.5 cm$^3$ per minute under a standard condition, so that the interior of chamber is increased to and maintained at a pressure of 0.5 Pa. Subsequently, a 200 W high-frequency power is applied to produce an oxygen plasma, so that the plasma etching is effected. A time period required for the plasma etching to achieve exposure of clean surfaces of the transparent electrodes 2 is about 2 hours.

Thereafter, the procedures used in the above first embodiment are followed to fabricate an organic EL device. The organic EL device thus fabricated was evaluated for emission characteristics. No emission was observed at an applied voltage of 3 volts. Applied voltages of 5 volts and 10 volts produced green emissions with luminances of 7 cd/m$^2$ and 3,000 cd/m$^2$, respectively. The application of 15 volts resulted in the occurrence of short to cause breakage of the organic EL device.

A continuous emission test was conducted by continuously applying a DC voltage to the organic EL device which initially exhibited a luminance of 500 cd/m $^2$. The luminance half life was reported as being about 600 hours.

At the completion of the process shown in FIG. 1(c), the transparent electrode 2 was at its surface measured for ionization potential. The results revealed the ionization potential of 4.64 eV, when a vacuum level was taken as a reference zero level.

It is believed that, as a result of the insufficient cleanness of the transparent electrode surfaces, the organic EL device embodiment fabricated with the use of a plasma etching technique exhibited reduced characteristics relative to the organic EL device embodiment fabricated with the use of a UV etching technique. That is, the difference in energy level between the transparent electrode 2 surface and the organic hole injecting and transporting layer 3 is calculated to be (5.0–4.64) eV, i.e., about 0.4 eV, which is a rather increased value compared to that determined in the first embodiment. This is considered responsible for the reduced efficiency of hole injection from the transparent electrodes 2 to the organic hole injecting and transporting layer 3, which resulted in the failure to obtain satisfactory characteristics.

Figure 3:
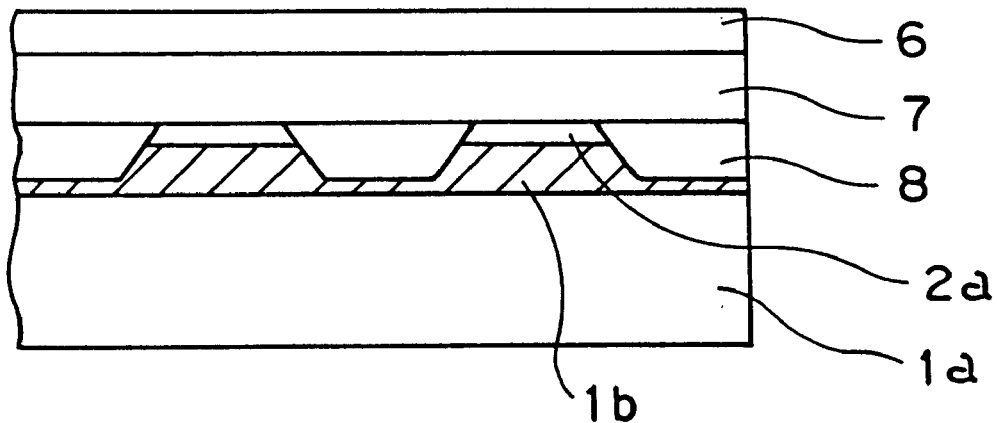
FIG. 3 is a fragmentary sectional view, illustrating another embodiment of an organic electroluminescent device in accordance with the present invention.
Figure 4:
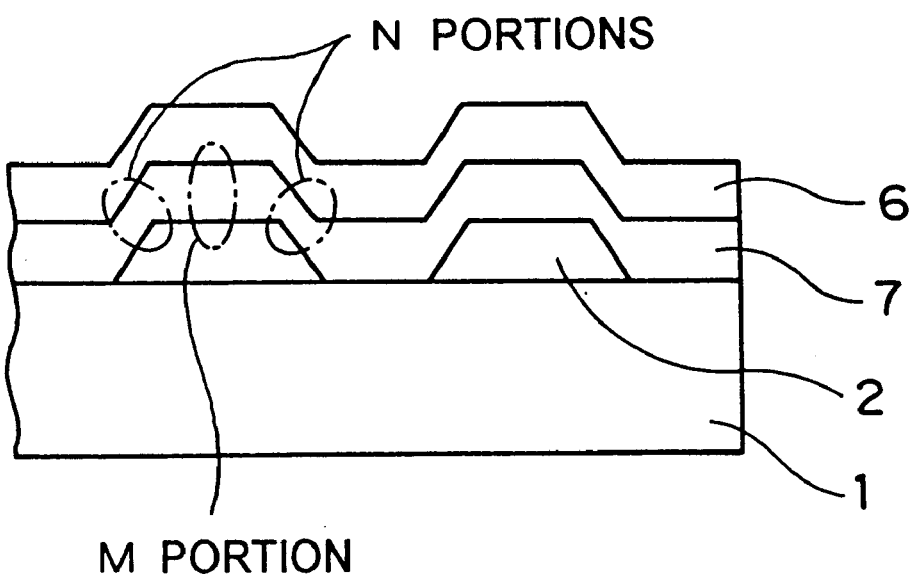
FIG. 4 is a fragmentary sectional view, illustrating a prior art organic electroluminescent device.
Figure 5A:
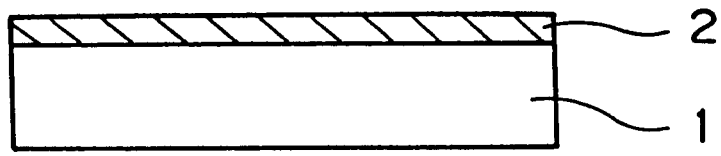
FIG. 5, parts 5(a) through 5(e) are fragmentary sectional views, illustrating a series of prior art processes for fabrication of a patterned electrode having a flat surface.
Figure 5B:
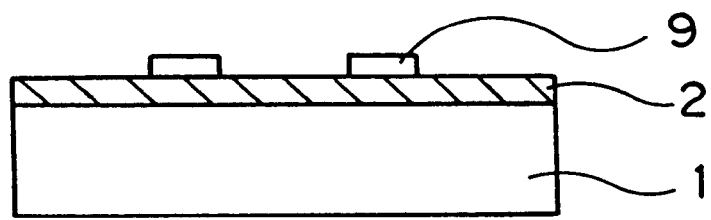
Figure 5C:
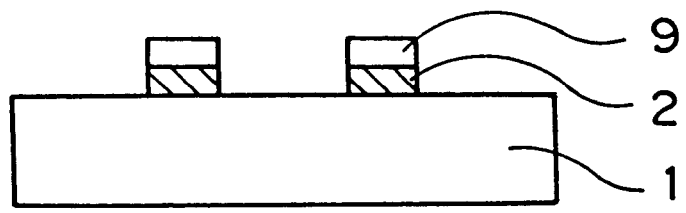
Figure 5D:
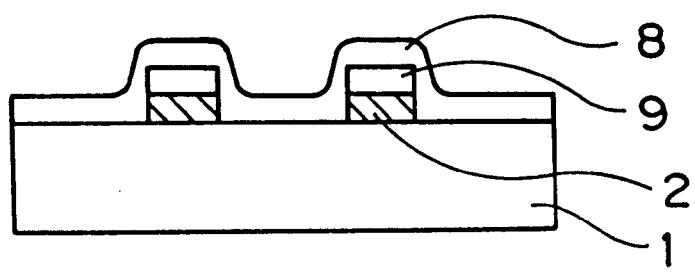
Figure 5E:
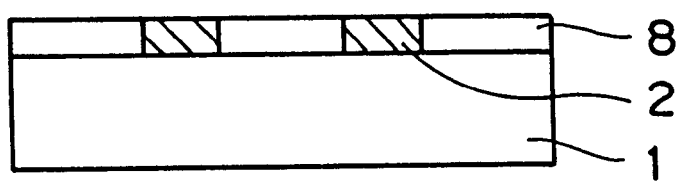

FIG. 3 is a fragmentary sectional view, illustrating a second embodiment of the organic EL device in accordance with the present invention. In this embodiment, a support 1a is employed carrying a thin film transistor 1b thereon. A first electrode 2a overlies elevated portions of the support 1a. This first electrode 2a serves as a drain or source electrode for the thin film transistor 1b, or alternatively, may be electrically connected to a separate drain or source electrode.

In the same procedure as used in the first embodiment shown in FIG. 1, an insulation layer 8 is formed to overlie the first electrode 2a. The insulation layer thus formed is subsequently UV etched under the oxygen atmosphere to remove its surface portion until a surface of the first electrode 2a is exposed to outside. Following the etching process, an organic EL layer 7 and a back electrode 6 are sequentially stacked on a common top surface of the first electrode 2a and insulation layer 8.

A configuration and a method for fabrication of the thin film transistor is not particularly limited. Those disclosed in Japanese Patent Laying-Open Nos. Hei 8-54836 (1996) and Hei 8-234683 (1996) may be utilized, for example. Particularly preferred is a bottom gated thin film transistor using a polycrystalline silicon thin film.

While the use of low-density polyethylene was exemplified in the above embodiment, a material to form the insulation layer 8 is not limited thereto, and may be a thermoplastic or heat fusible insulative material.

Where a melt of such material is cast to form the insulation layer 8, the material melt during the casting process may be maintained at a temperature level sufficient to insure suitable fluidity thereof but insufficient to cause an adverse heat effect on the support and first electrode. Examples of materials suitable for use in the formation of the insulation layer are listed below, with the addition of suitable casting temperature ranges written in parentheses.

Polyolefins (140° C.–320° C.) such as polypropylene (190° C.–290° C.) and polybutylene (140° C.–190° C.), methyl pentenes (270° C.–320° C.), EVA resins (180° C.–220° C.), AS resins (180° C.–290° C.), methyl methacrylate-styrene copolymers (170° C.–260° C.), polyarenes such as polystyrenes (180° C.–270° C.), polyethylene terephthalates (270° C.–320° C.), polyesters (220° C.–410° C.), methyl polymethacrylates (160° C.–260° C.), polycarbonates (280° C.–300° C.), polyacetals (180° C.–240° C.), polyphenylene ethers (220° C.–350° C.), polyallyl ether ketones (380° C.–430° C.), polyether ketones (350° C.–400° C.), thermoplastic polyimides (340° C.–425° C.), polyacrylonitriles (180° C.–210° C.), polyamideimide resins (320° C.–370° C.), polyether imides (340° C.–430° C.), polyamides (230° C.–300° C.), polyurethanes (220° C.–270° C.), fluororesins (180° C.–310° C.) such as PCTFE (polychlorotrifluoroethylene) and polyvinylidene fluoride, polyvinyl chlorides (150° C.–210° C.), polyvinylidene chlorides (150° C.–200° C.), chlorinated polyethylenes (150° C.–200° C.), polysulfones (330° C.–400° C.), polyether sulfones (310° C.–400° C.), polyphenylene sulfides (310° C.–340° C.), silicone resins, polysiloxanes, polysiloxanyl methacrylates (170° C.–290° C.) and the like.

In order to impart an increased heat resistance to the organic EL device, a material having a melting point of at least 100° C. may preferably be employed to form the insulation layer 8. It is also preferred that a material to constitute the insulation layer 8 exhibits a reduced degree of heat shrinkability.

Also, in order to impart an enhanced light emitting efficiency to the organic EL device, a material having a reduced refractive index relative to the transparent electrode 2 may preferably be employed to form the insulation layer 8.

The ITO transparent electrode used in the embodiment of the present invention revealed a refractive index of 1.9, relative to a D line with a wavelength of 589 nm. Examples of materials suitable for use in the formation of the insulation layer having a reduced refractive index are listed below, with the addition of representative values for refractive index written in parentheses.

Fluororesins (1.41), methyl polymethacrylates (1.49), polycarbonates (1.59), polystyrenes (1.59) and polysiloxanes (1.4–1.9).

A third embodiment to practice the method for fabrication of an organic electroluminescent device in accordance with the present invention is now described.

The procedure of the first embodiment is followed to fabricate an organic EL device, except that, instead of polyethylene, polyvinylidene chloride having a melting point of 155° C. is employed to form the insulation layer 8. Preferred for use as the aforementioned polyvinylidene chloride is a polyvinylidene chloride homopolymer or a copolymer containing acrylonitrile, either having a melting point within the range of 150° C.–205° C. During the casting process, the aforementioned polyvinylidene chloride is maintained at a temperature of 230° C. The casting temperature is permitted to vary, for example, within the range of 150° C.–335° C., preferably within the range of 180° C.–300° C., more preferably within the range of 205° C.–265° C.

Also, during the casting process, the aforementioned glass support 1 is maintained at a temperature of 100° C. This glass support temperature is permitted to vary within the range of 0° C.–145° C., preferably within the range of 40° C.–130° C., more preferably within the range of 70° C.–115° C.

The polyvinylidene chloride insulation layer 8 revealed a refractive index of 1.95, relative to a D line with a wavelength of 589 nm.

The organic EL device thus fabricated was then evaluated for emission characteristics. The results indicated a luminance of 70 cd/m$^2$ at an applied voltage of 5 volts and a luminance of 4,500 cd/m$^2$ at an applied voltage of 10 volts. Accordingly, the luminance of the resulting organic EL device was reduced by about 10% from that of the organic EL device fabricated in the first embodiment. This may be explained by the following reason. Due to the increased refractive index (1.95) of polyvinylidene chloride relative to that (1.90) of the ITO transparent electrode, an efficiency is reduced with which the light emitted from the EL layer passes through the ITO transparent electrode and the glass support to exterior of the device. On the other hand, the increased proportion of the light is absorbed by the polyvinylidene chloride insulation layer, while repeating reflections therein, to result in the increased loss of light.

TPD and Alq$_3$ for constituting the organic EL layer both revealed a refractive index of 1.7.

While the above embodiment involves melt casting an insulative material to form the insulation layer 8, the present invention is not limited thereto. For example, the insulative material may be dissolved in a solvent to provide a solution which is subsequently cast and dried for removal of the solvent to thereby form the insulation layer. Such a solvent may preferably be carefully purified to exclude any impurity such as a moisture therefrom. A weak acid substance may preferably used as the solvent.

Specific insulative materials which can be suitably dissolved into a solvent to provide such a casting solution include EVA resins, polystyrenes, AS resins, ABS resins, methyl polymethacrylates, polycarbonates, polyphenylene ethers, polysulfones and the like, for example.

What is claimed is:

1. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein said insulation layer is formed from a substantially insulative polymer, wherein said substantially insulative polymer is a substance which flows when exposed to heat.

2. The method of claim 1, wherein, in the removing step, said surface portion is plasma etched.

3. The method of claim 1, wherein said first electrodes are strip-form electrodes.

4. The method of claim 3, wherein said step of forming said insulation layer is performed by depositing a melt of said substantially insulative polymer to overlie said first electrodes and cooling to solidify the melt to form the insulation layer.

5. The method of claim 4, wherein said melt of the substantially insulative polymer is cast deposited to overlie said first electrodes.

6. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein said insulation layer is formed from a substantially insulative polymer, wherein said substantially insulative polymer is dissolved into a solvent to provide a solution which is subsequently cast over the first electrodes and dried for removal of the solvent to form said insulation layer.

7. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein a material for forming said insulation layer is selected so that its refractive index is smaller than that of the first electrodes.

8. The method of claim 7, wherein said refractive index of said insulation layer is at least 3% less than a refractive index of said first electrode.

9. The method of claim 7, wherein said insulation layer is formed from the material having a refractive index of less than 1.9.

10. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein, in the removing step, said surface portion is UV etched under an oxygen-containing atmosphere.

11. The method of claim 10, wherein said atmosphere contains ozone in the concentration of at least 0.01 g/m$^3$.

12. The method of claim 10, wherein said UV etching is performed so that an absolute value of ionization potential of said first electrode is at least 4.7 eV.

13. The method of claim 10, wherein said UV etching is performed so that a difference in ionization potential between the first electrode and an layer constituting said organic electroluminescent layer and being in direct contact with the first electrode is not higher than 0.3 eV.

14. The method of claim 6, wherein, in the removing step, said surface portion is plasma etched.

15. The method of claim 6, wherein said atmosphere contains ozone in the concentration of at least 0.01 g/m$^3$.

16. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein, in the removing step, said surface portion is plasma etched, wherein said plasma etching is performed so that an absolute value of ionization potential of said first electrode is at least 4.7 eV.

17. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer;

wherein, in the removing step, said surface portion is plasma is plasma etched, wherein said plasma etching is performed so that a difference in ionization potential between the first electrode and a layer constituting said organic electroluminescent layer and being in direct contact with the first electrode is not higher than 0.3 eV.

18. The method of claim 7, wherein, in the removing step, said surface portion is plasma etched.

19. The method of claim 7, wherein said first electrodes are strip-form electrodes.

20. The method of claim 6, wherein said first electrodes are strip-form electrodes.

21. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer, wherein said support carries a thin film transistor thereon and said first electrodes serves as a drain or source electrode for the thin film transistor.

22. A method for fabrication of an organic electroluminescent device comprising the steps of:

providing a set of first electrodes which are spaced apart from each other on a principal surface of a support;

forming an insulation layer to overlie said first electrodes as well as open regions between the first electrodes so that the insulation layer defines a substantially smooth top surface;

removing a surface portion of the insulation layer to a level sufficient to expose clean top surfaces of the first electrodes so that the insulation layer and the first electrodes have a common top surface;

forming an organic electroluminescent layer on the common top surface; and forming a second electrode on the organic electroluminescent layer, wherein said support carries a thin film transistor thereon and said first electrodes is electrically connected to a separate drain or source electrode for the thin film transistor.

* * * * *